(12) United States Patent
Phillips

(10) Patent No.: US 7,590,518 B2
(45) Date of Patent: Sep. 15, 2009

(54) CIRCUIT ANALYSIS UTILIZING RANK REVEALING FACTORIZATION

(75) Inventor: Joel R. Phillips, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 176 days.

(21) Appl. No.: 10/932,406

(22) Filed: Sep. 2, 2004

(65) Prior Publication Data

US 2006/0095236 A1 May 4, 2006

(51) Int. Cl.
*G06F 17/50* (2006.01)
(52) U.S. Cl. .......................................... 703/13; 703/14
(58) Field of Classification Search .................... 703/13, 703/14
See application file for complete search history.

(56) References Cited

U.S. PATENT DOCUMENTS 6,349,272 B1    2/2002    Phillips

OTHER PUBLICATIONS

Jing-Rebecca Li and Frank Wang and Jacob K. White, An Efficient Lyapunov Equation-Based Approach for Generating Reduced-Order Models of Interconnect, 1999 Design Automation Conference, pp. 1-6.*
Ying Liu et al., Model order-reduction of RC(L) interconnect including variational analysis, Design Automation Conference, Jun. 21, 1999-Jun. 25, 1999, pp. 201-206.*
Misra et al., Structural invariants of generalized state space systems, American Control Conference, Jun. 29-Jul. 1, 1994, vol. 3, ISBN: 0-7803-1783-1, pp. 3548-3552.*
Stewart, An updating algorithm for subspace tracking, Jun. 1992, IEEE Transactions on Signal Processing, vol. 40, Issue: 6, pp. 1535-1541.*
Markovsky et al., Stability of reduced order models in subspace identification, May 8, 2003, IAP Study Day, Louvain-la-Neuve, Auditorium SC03, Place des Sciences, p. 1.*
Nuno Marques et al., Improving The Efficiency Of Parasitic Extraction And Simulation Of 3D Interconnect Models, Sep. 1999, ICEC'99—IEEE International Conference on Electronics, Circuits and Systems, Cyprus, pp. 1729-1732.*

(Continued)

*Primary Examiner*—Paul L Rodriguez
*Assistant Examiner*—Juan C Ochoa
(74) *Attorney, Agent, or Firm*—Vista IP Law Group, LLP.

(57) ABSTRACT

Method of forming a reduced model of a circuit. A circuit parameter is selected, and a plurality of values for the parameter are selected. A circuit or operator equation is solved for the selected plurality of values to generate a result. The acts of selecting parameter and its plurality of values and solving the equation are repeated to generate sufficient results to form a reduced model. For each iteration, a rank revealing factorization is performed on the matrix for use in determining whether a sufficient number of results or vectors have been generated to form the reduced model so as to form a reduced model. In the plurality of values for a selected parameter, there may exist large deviation between two of the plurality of values for a selected parameter, and such deviation need not be based upon a nominal point or deviation thereof.

36 Claims, 1 Drawing Sheet

OTHER PUBLICATIONS

Chan, T.F. "Rank Revealing QR Factorizations" Lin. Alg. Appl., 1987, vols. 88/89, pp. 67-82, Elsevier Science Publishing Co., Inc., New York, NY.

Daniel, L. et al. "Geometrically parametrized interconnect performance models for interconnect synthesis" Proceedings of the 2002 International Symposium on Physical Design (ISPD '02), San Diego, CA Apr. 7-10, 2002, pp. 202-207.

Daniel, L. et al. "Automatic Generation of Geometrically Parameterized Reduced Order Models for Integrated Spiral RF-Inductors" Behavioral Modeling and Simulation (BMAS 2003), Monte Mar, CA, Oct. 7-8, 2003, pp. 1-6.

Daniel, L. et al. "A Multiparameter Moment-Matching Model-Reduction Approach for Generating Geometrically Parameterized Interconnect Performance Models" IEEE Transactions on Computer-Aided Design of Integrated Circuits and Systems, May 2004, vol. 23, No. 5, pp. 678-693.

Ellner, N. et al. "Alternating Direction Implicit Iteration for Systems with Complex Spectra" Siam Journal of Numerical Analysis, Jun. 1991, vol. 38, No. 3, pp. 859-870.

Feldmann, P. et al. "Efficient Linear Circuit Analysis by Padé Approximation via the Lanczos Process" IEEE Transactions on Computer-Aided Design of Integrated Circuits and Systems, May 1995, vol. 14, No. 5, pp. 639-649.

Glover, K. "All optimal Hankel-norm approximations of linear multivariable systems and their L(infinity)-error bounds" International Journal of Control, 1984, vol. 39, No. 6, pp. 1115-1193.

Grimme, E. "Krylov Projection Methods for Model Reduction" PhD thesis, Coordinated-Science Laboratory, University of Illinois at Urbana-Champaign, Urbana-Champaign, IL, 1997.

Gunupudi, P.K. et al. "Nonlinear Circuit-Reduction of High-Speed Interconnect Networks Using Congruent Transformation Techniques" IEEE Transactions on Advanced Packaging, Aug. 2001, vol. 24, No. 3, pp. 317-325.

Heydari, P. et al. "Model Reduction of Variable-Geometry Interconnects using Variational Spectrally-Weighted Balanced Truncation" Proceedings of the 2001 IEEE/ACM International Conference on Computer-Aided Design (ICCAD 2001), San Jose, CA, Nov. 4-8, 2001, pp. 586-591.

Lu, A. et al. "Solution of Lyapunov Equations by Alternating Direction Implicit Iteration" Computers Math. Applic., 1991, vol. 21 No. 9, pp. 43-58.

Moore, B. "Principal Component Analysis in Linear Systems: Controllability, Observability, and Model Reduction" IEEE Transactions on Automatic Control, Feb. 1981, vol. 26, No. 1, pp. 17-32.

Obadasioglu, A. et al. "PRIMA: Passive Reduced-Order Interconnect Macromodeling Algorithm" IEEE Transactions on Computer-Aided Design of Integrated Circuits and Systems, Aug. 1998, vol. 17, No. 8, pp. 645-654.

Phillips, J. R. "Projection-Based Approaches for Model Reduction of Weakly Nonlinear, Time-Varying Systems" IEEE Transactions on Computer-Aided Design of Integrated Circuits and Systems, Feb. 2003, vol. 22, No. 2, pp. 171-187.

Phillips, J. R. "A statistical perspective on nonlinear model reduction" Proceedings of the 2003 International Workshop on Behavioral Modeling and Simulation (BMAS 2003) Oct. 7-8, 2003, pp. 41-46.

Phillips, J. R. et al. "Analog Macromodeling using Kernel Methods" Proceedings of the IEEE/ACM International Conference on Computer-Aided Design (ICCAD-2003), Santa Clara, CA, Nov. 9-13, 2003, pp. 446-453.

Phillips, J. R. et al. "Poor Man's TBR: A Simple Model Reduction Scheme" Proceedings of the Design, Automation and test in Europe Conference and Exhibition, (DATE '04), Paris, France, Feb. 16-20, 2004, vol. 2, pp. 938-943.

Phillips, J.R. "Variational Interconnect Analysis via PMTBR" Proceedings of the IEEE/ACM International Conference on Computer-Aided Design (ICCAD-2004), Nov. 7-11, 2004, pp. 872-879.

Roychowdhury, J. "Reduced-Order Modeling of Time-Varying Systems" IEEE Transactions on Circuits and Systems II: Analog and Digital Signal Processing, Oct. 1999, vol. 46, No. 10, pp. 1273-1288.

Safonov, M. G. et al. "A Schur Method for Balanced Truncation Model Reduction" IEEE Transactions on Automatic Control, Jul. 1989, vol. 34, No. 7, pp. 729-733.

Starke, G. "Optimal Alternating Direction Implicit Parameters for Nonsymmetrical Systems of Linear Equations" Siam Journal of Numerical Analysis, Oct. 1991, vol. 28, No. 5, pp. 1431-1445.

Stroud, A.H. "Approximate Calculation of Multiple Integrals", 1971, Title Page, Table of Contents, pp. 1-326, Prentice-Hall, Englewood Cliffs, NJ.

Papoulis, A. Probability, Random Variables, and Stochastic Processes, 1991, Title Page, Table of Contents, Chapters 1-10, McGraw Hill, New York, NY.

* cited by examiner

CIRCUIT ANALYSIS UTILIZING RANK REVEALING FACTORIZATION

FIELD OF THE INVENTION

The present invention is generally directed to modeling circuits and interconnects of circuits, and more particularly, to a method of using a rank revealing factorization to model process variations and determine an optimal amount of data that should be used in order to generate a smaller representation of a circuit or interconnections between circuit components.

BACKGROUND

Various techniques have been used to model circuits and the interconnections between circuit components, otherwise referred to as a circuit interconnect. Naturally, the larger the circuit or circuit interconnect, the more complicated and time consuming it is to model these systems.

It is known to represent or re-express an original circuit model or representation using model order reduction techniques to form a smaller or reduced model or representation of the original model. For example, if an original model includes 1,000 signals, a reduced model may include, for example, 50 or 100 signals. Verification is performed by running simulations on the reduced model. Running simulations on smaller models saves time and money compared to analyzing larger, original models or representations.

The reduced models, however, should not lose important information in the original model and thus not accurately reflect the original model. Likewise, the reduced model should not be too large. While a larger reduced model may more accurately reflect the original representation, it also involves more computation and time consuming processing. Conventional systems involve tradeoffs involving the size of the reduced model, simulation time and costs, and the accuracy of a reduced model.

Another issue that arises in generating reduced models of circuits and interconnects is modeling variations, in particular, fabrication and processing variations. These variations may include thickness, width, inter-line spacing, conductivity, and local geometry effects, such as chemical-mechanical polish (CMP) induced inter-layer dielectric or metal thickness variations. For example, if a connection line on a chip is designed to have a width of 0.2 microns, the line that is actually fabricated may have a width of 0.18 microns or about 0.22 microns, or a variation of about 10%. These process variations can have significant negative effects on circuits or interconnects, particularly circuits using smaller geometries and circuits that are sensitive to such deviations, such as analog or Radio Frequency (RF) circuits. These variations can be caused by process adjustments, deviations in underlying process variables, or other unknown causes. In known systems, process variations are typically modeled as random variation in conventional modeling methods.

In one known system, interconnect modeling in a parameter variation context includes two main steps: 1. variation of unreduced circuit matrices, and 2. selecting a projection matrix, which may involve linearization and Taylor Series expansions, as discussed in further detail below.

Linearization

Linearization techniques are based on an assumption that parameter-varying matrices can be expressed as small linear deviations or perturbations from a nominal value, otherwise referred to as a "PERT" or perturbation technique. This PERT technique leads to a related model:

$$G(\lambda_1, \ldots, \lambda_M) = G_0 + \sum_k \Delta G_k \delta \lambda_k, \quad (5)$$

$$C(\lambda_1, \ldots, \lambda_M) = C_0 + \sum_k \Delta C_k \delta \lambda_k.$$

Thus, linearization and its small linear deviations can be described as using a first order linear correction of the variations or perturbations.

The choice of the projection matrix is then considered. Perturbational approaches can be used to compute projection matrices V using deviations ($\lambda_1, \lambda_2, \ldots$). For example, one technique uses the expansion to second order (without cross-terms)

$$V(\lambda_1, \ldots, \lambda_M) = G_0 + \sum_k \Delta V_k^{(1)} \delta \lambda_k + \sum_k \Delta V_k^{(2)} (\delta \lambda_k)^2 \quad (6)$$

In this approach, once the coefficients $V_k^{(1)}$ and $V_k^{(2)}$ are calculated, and the reduced model is obtained from $$\hat{G}(\lambda_1, \ldots, \lambda_M) = V(\lambda_1, \ldots, \lambda_M)^T G(\lambda_1, \ldots, \lambda_M) V(\lambda_1, \ldots, \lambda_M) \quad (7)$$

by substituting equations 5 and 6 into equation 7, and dropping terms of higher than second order in the variations $\delta$.

One conventional technique calculates the terms in equation 6 by quadratic fitting on each coordinate. If the nominal value of each parameter is identified by $\lambda_k$, then for each parameter $\lambda_k$, the subspaces $V(\lambda 1, \ldots \lambda_k+\delta\lambda_k, \ldots \delta\lambda_M)$ and $V(\lambda 1, \ldots \lambda_k-\delta\lambda_k, \ldots \delta\lambda_M)$ are computed. The coefficients $\Delta V_k^{(1)} \delta$ are obtained from a fit to these values, plus the nominal. 2M+1 Krylov spaces must be computed. If Krylov spaces of order Q are used for reduction, this procedure requires 2M+1 matrix factorizations, generates Q(2M+1) Krylov vectors, and produces a final model of size Q.

Linearization techniques, however, have a number of shortcomings. For example, linearization is not effective when using a large number of parameters. It requires too much time and, in turn, results in higher costs. Additionally, linearization is typically only accurate within a small range of values since the schemes break down for large deviations from a nominal value. Further, the assumptions that are used in linearization may not be accurate, leading to inaccurate variation modeling. Moreover, there is no indication or manner of controlling when a linearization analysis should be terminated. In other words, there is no control or indication over how much data will be collected and used to form a reduced model. Consequently, one can only guess as to when a sufficient amount of data has been obtained.

Taylor Series

Another conventional modeling approach uses multi-dimensional Taylor series expansions, otherwise referred to as tensor product moment schemes. Rather than explicitly modeling a perturbational form of projection matrices in linearization, a projection space is constructed that matches multi-dimensional moments. The transfer function $$H(s) = L^T X(s) \quad (8)$$

$$X(s) = [sC(\lambda_1, \ldots, \lambda_M) + G(\lambda_1, \ldots, \lambda_M)]^{-1} B \quad (9)$$

is expanded in polynomials of s as well as the parameters $\lambda$:

$$X(s) = \Sigma(X_{j,k_1,k_2,\ldots k_M}) s^j \lambda_1^{(k_1)} \ldots \lambda_M^{(k_M)} \quad (10)$$

A subset of the (vector) coefficients $X_{j, k_1, k_2, \ldots}$) is used to form the Krylov space by, for example, taking expansions to second order in all parameters. Thus, this can be considered to be a generalization of the perturbation or linearization scheme and roughly corresponds to taking only the $(2M+1)Q$ terms $j=1, \ldots, Q, k_1, \ldots, k_M=(0,1)$). Such generalization, however, comes at a cost.

The full space to order p with a set of n parameters includes a set $$Q_{max}^{(p)} = \sum_{k=0}^{p} \left( \frac{(k+n-1)!}{k!(n-1)!} \right) \quad (11)$$

of parameters. For example, expansions to second order in four parameters require generating 15 vectors. The number of vectors that is required grows exponentially with the model order and number of parameters. The exponential growth makes generation of models of high order impractical and substantially increases computational costs. This problem also occurs in Volterra-series motivated approaches to non-linear model reduction and is a concern that arises when forming representations for objects in higher-dimensional spaces via Cartesian product constructions.

A further shortcoming is that Taylor Series schemes retain all the $Q_{max}^{(p)}$ vectors $X_{j, k_1, k_2}, \ldots$ for construction of the final model. This leads to a larger model of size $Q_{max}^{(p)}$ instead of a smaller size p. Further, for a given problem, both linearization and Taylor Series methods cannot be candidates. If the PERT method is sufficiently accurate, there is no need to use the TP-M scheme, but the TP-M method must be adopted when the PERT method is inaccurate. There does not, however, appear to be a good method of determining the accuracy of either scheme.

Accordingly, there exists a need for a circuit or circuit interconnect modeling technique that provides accurate and optimally sized interconnect models that account for variations by providing an indication as to when a sufficient amount of data has been obtained, improving upon the shortcomings of prior reduction techniques.

SUMMARY

In accordance with one embodiment, a method of forming a reduced model of a circuit initially involves selecting a parameter of the circuit and selecting a value for the selected parameter. An equation is solved for the selected value, thereby generating a result. The selecting and solving steps are repeated to generate corresponding equation results, and for each iteration of selecting and solving or for each result, a determination is made whether a sufficient number of results have been generated to form the reduced model. A reduced model of the circuit is generated using the determined number of results generated from solving the equation.

In an alternative embodiment, a method of forming a reduced model of a circuit involves a rank revealing factorization. Initially, a circuit parameter is selected, and values for the selected parameter are also selected, without reference to a nominal value. An equation is solved for the selected value, thereby generating a result. The selecting and solving steps are repeated to generate corresponding results, and for each iteration of selecting and solving, a rank revealing factorization is performed on the collection or accumulation of results that are generated by solving the equation. The outputs of the rank revealing factorization are used to determine whether a sufficient number of results have been generated to form the reduced model. A reduced model is then generated using the determined number of results generated by solving the equation.

In a further embodiment, a reduced model is formed using a singular value decomposition. Initially, a parameter of the circuit is selected, and values for the selected parameter are also selected, without reference to a nominal value. An equation is solved for the selected value, thereby generating a result. The selecting and solving steps are repeated to generate corresponding results, and for each iteration, a singular value decomposition is performed on the collection or accumulation of results. Values generated by the singular value decomposition indicate a quantity of information embodied in the result for use in determining whether a sufficient number of results have been generated to form the reduced model. A reduced model is then generated using the determined number of results.

In various embodiments, the parameter can be associated with a process for manufacturing the circuit or be a parameter of an electrical component. For example, process parameters may include a thickness or a width of a circuit component an inter-line spacing of a circuit component, a conductivity or a dielectric constant of a circuit component, a metal density of a circuit component, or an inter-layer dielectric thickness of a circuit component. Circuit component parameters may include a current, a voltage, a resistance, a capacitance, an inductance, or a frequency of the circuit component.

Further, values can be selected using, for example, a Gaussian rule, a Monte Carlo rule, a quasi-Monte Carlo rule, a hyperbolic crosspoint construction, a tensor product rule, or a Latin Hypercube sampling. The selection of values can also be adjusting using, for example, a truncated balance realization.

The rank revealing factorization that is used to determine whether a sufficient number of results have been generated by solving the equation to produce the reduced model can be a rank revealing factorization, such as a singular value decomposition. With a singular value decomposition, a rank revealing factorization of ZW is performed, wherein Z is a matrix, W is a diagonal matrix, and a singular value decomposition of ZW is $ZW=V_z S_z U_z$.

The matrix Sz comprising singular values, which indicate the importance or significance of each vector or column in matrix V, indicating how much information each new vector or column result of each iteration adds to a matrix for determining whether a sufficient number of results have been generated to form the reduced model. Each iteration of executing the equation generates a vector or column result that is of less relative significance than a vector or column result generated by a previous iteration of the equation.

Other rank revealing factorizations that can be used include a ULV/URV decomposition, a UTV decomposition and rank-revealing QR or "RRQR" factorization.

DETAILED DESCRIPTION

Background and Theoretical Basis for Embodiments

Figure 1:
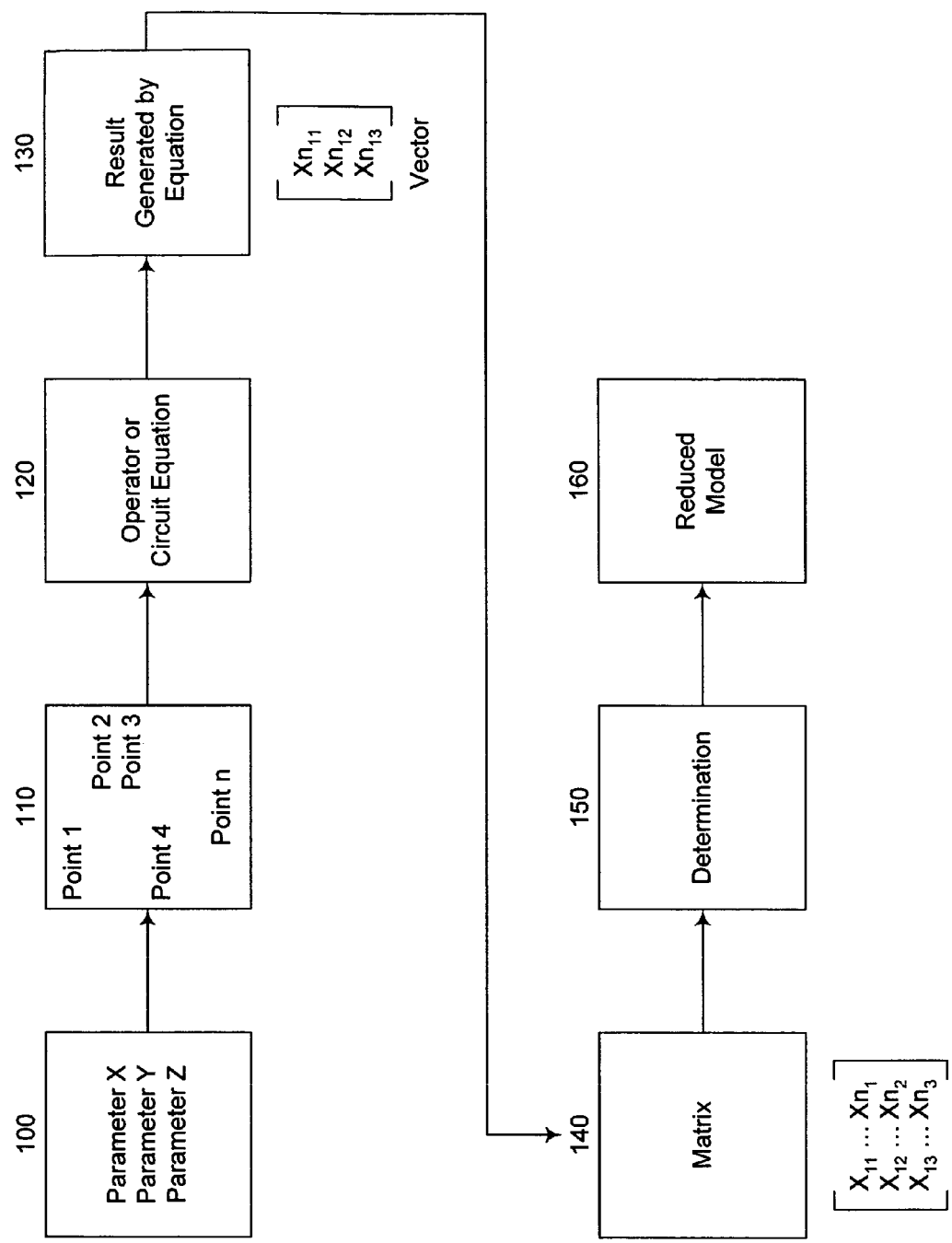
FIG. 1 is a system flow diagram illustrating according to one embodiment.

In the following description, reference is made to the accompanying drawings which form a part hereof, and which show by way of illustration in which various embodiments may be practiced.

Before discussing in detail embodiments of modeling methods, this specification initially provides a brief summary of Truncated Balanced Realization (TBR). TBR is the foundation for the operation of embodiments that can generate accurate and optimally sized reduced interconnect models. Persons of ordinary skill in the art will appreciate that various embodiments can use modeling implementations that are based on or consistent with TBR.

TBR

Initially, an assumption can be made that the equation $$C\frac{dx}{dt} + Gx = Bu, \ y = L^T x \tag{11}$$

takes a linear system model as input and can be formulated so that C=I, G=−A for some A. TBR is based on an analysis of a controllability Granimian X and an observability Grammian Y. These Granimians X and Y can be calculated from Lyapunov equations as $$AX + XA^T = -BB^T \tag{12}$$

$$A^T Y + YA = -LL^T \tag{13}$$

Reduction is performed by projection onto invariant subspaces that are associated with dominant eigenvalues of the product of Grammians XY. If $\sigma_k$ denotes the square root of the kth largest eigenvalue of XY (XY has real eigenvalues), then the error in the transfer function of the order k TBR approximation is bounded by $$\sum_{l=k}^{16N} \sigma_k.$$

PMTBR

The TBR analysis can be modified to form what is referred to as a "Poor Man's" TBR or PMTBR. The PMTBR analysis involves computing the controllability Grammian X in the time domain as $$X = \int_0^\infty e^{At} BB^T e^{A^T t} dt. \tag{14}$$

From Parseval's theorem, and considering that the Laplace transform of $e^{At}$ is $(sI - A)^{-1}$, the alternative frequency-domain expression is:

$$X = \int_{-\infty}^\infty (j\omega I - A)^{-1} BB^T (j\omega I - A)^{-H} d\omega. \tag{15}$$

In the general case, for the controllability Grammian X $$X = \int_{-\infty}^\infty (j\omega C + G)^{-1} BB^T (j\omega C + G)^{-H} d\omega. \tag{16}$$

and similarly for the observability Grammian Y. The PMTBR model reduction algorithm is motivated by considering the evaluation of the controllability Grammian X via numerical quadrature. Given a quadrature scheme with nodes and weights $w_k$ and defining $$z_k = (jw_k C + G)^{-1} B_j \tag{17}$$

an approximation could be computed as $$\hat{X} = \sum_k w_k z_k z_k^H. \tag{18}$$

Alternatively, if Z is a matrix, with columns $z_k$, and W a diagonal matrix with diagonal entries $W_{kk} = w_k$, a singular value decomposition or SVD of ZW can be performed as $$ZW = V_z S_z U_z \tag{19}$$

with $S_z$ as a real diagonal, and $V_z$ and $U_z$ as unitary matrices. The PMTBR uses the projection matrix $V = V_z$ for model reduction.

Against the backdrop of TBR and PMTBR, following is a further detailed explanation of the basis of the theory that supports method embodiments that provide an indication regarding when a sufficient amount of data has been acquired to generate an optimally sized model.

Initially, considering a stable ODE system dx/dt=Ax+Bu at time t=0 for an input u(t) active on t<0, the state x(0) is given by the operator $$x(0) = Lu \equiv \int_0^\infty e^{At} Bu(-t) dt. \tag{20}$$

The Grammian X may then be written as $$X = LL^\dagger \tag{21}$$

where † indicates adjoint. An interpretation of the Grammian X is that it is the covariance matrix for a Gaussian variable (x(0) in this case) obtained by exciting the ODE with "white noise", i.e. a flat-spectrum u and observing the state at time zero.

$$E\{x0x_0^T\} = E\{Luu^\dagger L^\dagger\} = LE\{uu^\dagger\} L^{554} = LL^{554} = X. \tag{22}$$

Assume further that the system is indexed by some statistical parameter λ, so that $$x(0) = L_\lambda u. \tag{23}$$

A principal components decomposition proceeds by computing the moments needed for second-order statistics $$X_\lambda = E\{LL\dagger\} \tag{24}$$

otherwise referred to as "variational Grammian." This can be computed in the frequency domain as $$X_\lambda = E\left\{\int_{-\infty}^\infty (j\omega C_\lambda + G_\lambda)^{-1} BB^T (j\omega C_\lambda + G_\lambda)^{-H} d\omega\right\}. \tag{25}$$

Assuming that a probability density for θ on some domain Sθ, this variational Grammian becomes $$X_\lambda = \int_{S\lambda} \int_{-\infty}^\infty (j\omega C_\lambda + G_\lambda)^{-1} BB^T (j\omega C_\lambda + G_\lambda)^{-H} p(\lambda) d\omega d\lambda. \tag{26}$$

If some prior knowledge of frequency content is available (an estimate of u(ω), it is incorporated into the variational Grammian X by multiplying by an additional spectral density factor w(ω) or modifying the probability density p(λ).

With the definition of the variational Grammian $X_\lambda$, construction of a model reduction procedure proceeds as in the deterministic case. The final algorithm for model reduction is shown as follows, and generally referred to as the "Poor Man's Variational TBR." Initially, a quadrature rule is selected. The quadrature rule has N nodes in an M+1 dimensional space (s, $\lambda 1, \ldots \lambda M$) with weights w. For each node I, the following is computered:

$$Z_i = [s_i C(\lambda_1^i, \ldots, \lambda_M^i) + G(\lambda_1^i, \ldots, \lambda_M^i)]^{-1} B.$$

Next, a matrix of columns $Z=[Z_1, Z_2, \ldots, Z_N]$ and weights $W_{ii}=w_i$ is formed.

A singular value decomposition of ZW is formed, and a projection space of V is constructed from the orthogonalized column span of Z, dropping columns whose associated singular values fall below a particular tolerance or threshold. The efficiency of the procedure depends directly on the number of nodes/weights that are needed to obtain good estimates of the dominant singular subspaces of $X_\lambda$ Modeling Embodiments This specification now describes further details of embodiments against the background of TBR, PM TBR and a theoretical basis for the operational embodiments.

Referring to FIG. 1, according to one embodiment, a method for generating a reduced model of a circuit includes selecting a parameter of a circuit (step 100), e.g., Parameter X of a group of Parameters X, Y and Z. In step 110, a plurality of values or points are selected for the selected parameter, e.g., Points 1-n (step 110). A circuit or operator equation is solved for each selected value (step 120), producing corresponding results, columns or vectors (step 130). As they are generated by each iteration of solving the operator equation, the vectors are added to a matrix (step 140). Thus, the matrix includes all of the vectors or columns that have been produced by solving the operator equation.

After each iteration of selecting a value and solving an operator equation, a determination (step 150) is made whether the matrix includes a sufficient number of columns or result vectors to form the reduced model. A reduced model using the determined number of results is then generated (step 160).

For example, in one embodiment, a rank revealing factorization, such as a singular value decomposition (SVD), can be performed on a matrix each time a new result or vector or column is added to the matrix. The SVD generates singular values, which provide an indication regarding how much data or information a new adds to the matrix that will be used to form the reduced model. Thus, the singular values generated by the SVD can be used to determine at which point additional values and resulting columns are no longer necessary to form a reduced model that represents the original model with satisfactory accuracy. Indeed, persons of ordinary skill in the art will appreciate that the amount of additional data that is needed to generate a reduced model can vary depending on the particular application and desired accuracy or tolerances. As a result, after it is determined that a sufficient number of values or columns have been generated, it is not necessary to solve the operator equation and add that data to the matrix, thereby making the reduced model larger, when a smaller model will do. Further, it is not necessary to exhaustibly enumerate all possible parameter and point combinations since the "low level" points are not used.

As will be understood, embodiments provide distinct advantages over conventional systems by identifying an appropriate number of parameter values or results that represent the dominant information of the original model that should be included in the reduced model. In other words, embodiments indicate an appropriate stopping point so that enough "important" information is included in the model to provide acceptable accuracy, while limiting the amount of "low importance" information in order to form smaller reduced models, thereby reducing computation time and costs. In other words, the resulting reduced model includes the most important, dominant or principal signals, while the less important or insignificant information that would otherwise inflate the size of the reduced model is excluded, thereby forming an optimally sized model. Each of these steps are discussed in further detail.

Selecting Parameters—Step 100.

Various circuit or process or fabrication parameters can be modeled with embodiments. Thus, embodiments are not necessary limited to modeling particular circuits, circuit designs or the interconnections between particular circuit components. Rather, embodiments may be used in various applications and circuit modeling purposes.

In embodiments that are used to model circuit processing or fabrication, the parameters to be included in a reduced interconnect model can be one or more of thickness, width, inter-line spacing, conductivity, and local geometry effects, such as chemical-mechanical polish (CMP) induced interlayer dielectric thickness variations and local metal density. Embodiments that are used to model actual circuit behavior or operation can use parameters or electrical characteristics such as resistance, voltage, capacitance, impedance, inductance, and frequency.

For purposes of explanation, but not limitation, this specification primarily discusses generating reduced models of circuit interconnects and related process or fabrication variations. Persons of ordinary skill in the art will appreciate that embodiments can be used in various other modeling applications and are not so limited. Thus, the parameters identified above are exemplary parameters that can be modeled using embodiments.

Selecting Parameter Values—Step 110.

After determining which parameters are to be included in a reduced model, there must be some manner or technique for selecting values of these process parameters.

Embodiments can use a variety of techniques to select values. For example, in one embodiment, Monte Carlo (MC) methods are used. In an alternative embodiment, quasi-Monte Carlo (QMC) methods are used. In further alternative embodiments, a Gaussian rule, a hyperbolic crosspoint construction, a Latin Hypercube sampling (LHS), or a tensor product rule can be used. Indeed, this list is not intended to be limiting. For purposes of explanation and not limitation, this specification discusses MC and QMC methods in further detail.

Monte Carlo

Monte Carlo techniques can be used to estimate the integral $$I = \int_S f(x) dx \qquad (29)$$

where x is in $R^n$ and S is the integration domain. The integral can be transformed to lie in a unit cube. A Monte Carlo estimation of the above equation includes drawing N random sample points $x_i$ in S from a uniform distribution, and forming the estimate $$I_{MC} = \frac{1}{N} \sum_{i=1}^{N} f(x_i). \qquad (30)$$

The estimator in the above equation converges with weak assumptions on the function f (e.g., weak smoothness assumptions). Asymptotic convergence of the estimator in the above equation is relatively slow, with the error decreasing as $N^{1/2}$, and irregular, due to the stochastic nature of the algorithm. However, in high dimensions, the performance of Monte Carlo methods is generally better than product rules. For example, assuming thirty dimensions, a product rule built from an underlying two-point 1 D rule uses over a billion quadrature nodes. The slow convergence properties of Monte Carlo, however, turn out to be dominated by the fast convergence of projection-based reduction in such a way that the overall modeling scheme requires a small number of sample points.

Quasi Monte Carlo

In an alternative embodiment, a quasi-Monte Carlo (QMC) method is utilized to select parameter points in a parameter space. A QMC method also uses an estimator of the form of equation 30 above, but the nodes $x_i$, instead of being drawn from a random distribution, are selected in a deterministic way from what is termed a low-discrepancy sequence. QMC methods preserve the character of Monte Carlo methods by distributing sample points throughout a high dimensional space, and improving convergence properties, using number-theoretic means, so that nodes will be evenly spread in the integration domain S, whereas, MC methods can be prone to "clustering" effects. Thus, QMC techniques can improve the asymptotic rate of convergence from $O(N^{-1/2})$ to $O(N^{-1})$.

In alternative embodiments, the manner in which parameter values are selected can be adjusted, as necessary. In one embodiment, the adjustment can be implemented by performing a variational truncated balance realization. Thus, the selection can be fixed or variable as needed.

Accordingly, embodiments select points or values in a different manner compared to conventional linearization methods. In particular, embodiments do not use a nominal point as a reference or starting point, and do not select points or values based on any particular deviation from the nominal point. Rather, points are essentially randomly selected in the parameter space.

While MC and QMC methods have been discussed in detail, persons of ordinary skill in the art will appreciate that other selection techniques can be utilized.

Solving Operator Equation, Generating Result/Vector; Forming Matrix With Results or Vectors—Steps 120-140.

Following selection of a parameter point or value, an operator or circuit equation is solved at the selected point or value. Solving the operator equation at a point produces a result or vector or column. This result is added to a matrix. Each time the operation equation is solved, another result is added to the matrix 140. Thus, the matrix 140 increases in size with each iteration of solving the operation equation. Various operator equations can be used depending on the modeling application. Thus, specific operator equations are not discussed in detail.

Operator equations are solved in a different manner compared to conventional linearization techniques. In particular, embodiments do not solve equations for points or values are selected around a nominal point.

Determining Number of Values/Results—Rank Revealing Factorization—Step 150.

After each iteration of solving the operator equation for the selected points, the results of solving the operator equation at each of these points is further processed using a rank revealing factorization or algorithm. A rank revealing factorization is performed for each new vector or result or column that is generated by solving the operator equation.

The matrix increases in size for each iteration of solving the operator equation and adding a result or vector or column to the matrix. A rank revealing factorization is performed on the matrix after each iteration. . In other words, a rank revealing factorization is performed on a matrix having a size that is larger than the matrix resulting from a prior iteration. For example, a rank revealing factorization can be applied to a matrix that includes one additional vector after each iteration. In other words, for purposes of explanation, a rank revealing factorization is performed for a matrix having one vector, then for a matrix having two vectors, then for a matrix having three vectors and so on until the rank revealing factorization provides an indication that no additional vectors are necessary which, in turn, provides an indication that no additional iterations of solving the operator equation are necessary. Thus, a rank revealing factorization is initially performed on a matrix having first number of vectors and then subsequently performed on a matrix having a second number of vectors, the second number of vectors being greater than the first number of vectors until the results of the rank revealing factorization satisfy a cut-off or desired accuracy of a reduced model. The results of the rank revealing factorization after each iteration allow a determination to be made whether additional operation equation iterations and applications of the rank revealing factorization to the resulting matrices are required to generate a reduced model.

In the described embodiments, rank revealing factorization analysis is conducted in the context of a projection procedure or a projection-based reduction such as, for example, the projection matrices and resulting reduced model as recited in Equation 7 above. Thus, a projection-based reduction can be conducted using results or outputs of a rank revealing factorization. Persons of ordinary skill in the art will appreciate that other equations may be utilized. For purposes of explanation, this specification refers to rank revealing factorizations in the context of projection procedures.

In one embodiment, the rank revealing factorization is a Singular Value Decomposition (SVD). In alternative embodiments, the rank revealing factorization is a ULV decomposition, a URV decomposition, a UTV decomposition or a rank-revealing QR or "RRQR" factorization. For purposes of explanation, but not limitation, this specification discusses in further detail a SVD rank revealing factorization, although persons of ordinary skill in the art will appreciate that ULV, URV, UTV and RRQR decompositions and other rank revealing decompositions can be utilized to determine when enough information has been gathered in a matrix to generate a reduced model.

More particularly, a projection matrix is formed by performing a SVD on the set of points or values resulting from solving the equation. The projection matrix includes three matrices:

$$ZW=V_Z S_Z U_Z \tag{19}$$

As previously discussed, Z is a matrix, with columns $Z_k$. W is a diagonal matrix with diagonal entries $W_{kk}=W_k$. A singular value decomposition or SVD of ZW can be performed as $$ZW=V_Z S_Z U_Z \tag{19}$$

where $S_z$ is a real diagonal, and $V_z$ and $U_z$ as unitary matrices. The diagonals of the matrix S are singular values. The singular values indicate the importance or significance of each vector or column added to V, the projection matrix. In other words, the values of the matrix S rank the importance of the columns of the projection matrix V and, correspondingly, indicate how much information each new vector or column result of executing the operator equation adds to the matrix that will be used to generate a reduced model. In this context, the matrices V and S are not the same, and the coefficients of V need not be inspected.

Thus, the value for a matrix having the first result or vector will have the highest value, and a matrix having columns or vectors for matrices resulting from subsequent SVDs have decreasing values. In other words, projection vector V1 will be more significant than projection vector V2, which has a larger value than V3 and so on. Thus, V1 includes more information that V2 and V3, and V2 includes more information than V3, and so on. In other words, the larger the value V, the more information being added to the model, and the smaller the value V, the less information being added to the model.

Thus, after the SVD, the relative significance of each additional or subsequent projection vector is less significant than the prior projection vector, thus providing a reliable and predictable manner of determining the relative significance of information that is added by each additional projection vector.

For example, assume that point 100 is selected, the operator equation is solved at point 100 to form column or vector 100, which is added to a matrix having columns 1-99. A SVD was previously performed on the matrix having columns 1-99, and is performed again on matrix having columns 1-100. Depending on the particular tolerances and accuracy, the cutoff for what is considered significant or important information can vary. For example, in one application, V90 may be considered to be the cutoff for significant information, whereas in another application, V100 may be the cutoff. Thus, there is no set standard or mandatory stopping point. Rather, the stopping point can vary. For example, the stopping point can be selected by a user or be determined by a particular application. Thus, a user may decide, or threshold value may be set, so that column 99 is included in the matrix that is used to form the reduced model since it provides a useful amount of information, but that column 100 is excluded since it adds only a small amount of additional information. Further, columns beyond column 100 can be excluded form the model since they do not provide useful information, thereby allowing an optimally sized matrix and model to be formed with the desired accuracy.

Of course, the example involving 100 columns is merely provided for purposes of explanation. Actual implementations may involve thousands of points, vectors or columns, and solving a rank revealing factorization thousands of times. Likewise, embodiments can exclude thousands of columns from being included in a matrix that is used to form a reduced model, thereby saving substantial costs and time.

Further, different thresholds can be set so that the size and accuracy of the model can be changed depending on particular needs. Accordingly, at some point, the SVD indicates the degree of "new" or "useful" information that is being added and the stopping point or cut off for adding new results from the operator equation.

The ability to determine when a sufficient number of points have been selected and a sufficient number of vectors have been generated provides significant enhancements over conventional methodologies. Embodiments provide the ability to generate an optimally sized model by providing a manner of determining when enough vectors have been generated to produce a large enough matrix to form a reduced model with sufficient accuracy. The model size can be based on, for example, user criteria or a predetermined threshold (e.g., a predetermined threshold of a projection matrix resulting from a SVD). As a result, only the most useful information is included in the reduced model, whereas less important or non-important information that would otherwise unnecessarily expand the size of the reduced model is omitted. Additionally, rank revealing factorization provides a reliable, controllable, and predictable manner of forming reduced models that can be configured for various applications and various degrees of accuracy. Further, using a rank revealing factorization reduces the costs and time associated with generating and analyzing models since it is not necessary to analyze portions of models that do not add useful information.

Embodiments also enable a user to adaptively adjust or change the selection of parameter values or points during the modeling process, the generation of results based on those points, and performing a rank revealing factorization. In other words, the selection can be adjusted on-the-fly, while the other conventional modeling steps require that the whole analysis be repeated after adding new points or values.

For example, if some prior knowledge of frequency content is available (an estimate of $u(\omega)$), it can be incorporated into the variational Grammian by multiplying by an additional spectral density factor $w(\omega)$ or otherwise modifying the probability density $p(\lambda)$. With the definition of the variational Grammian $X_\lambda$, construction of the model reduction procedure proceeds precisely as in the deterministic case or when the selection process is not changed mid-stream. The final algorithm for model reduction is generally referred to as the "Poor Man's Variational TBR" as previously discussed.

Mathematical Description of Determining

Having generally described how rank revealing factorizations, such as SVDs, can be used to determine an optimum amount of data that is used to form a reduced model, following is a more detailed mathematical description of the analysis. In the deterministic case in which process variations are not accounted for, standard techniques show that the, $\lambda_2$ error in the operator, $\lambda$ is bounded by $$\|x_0 - x_0{}_2^2)\| \le \sum_{k=Q+1}^{N} \sigma_k^2. \tag{31}$$

In the variational case, direct error bounds are not obtained. The variational TBR technique produces a decomposition of circuit modes that are orthogonal with respect to the probability density $p(\lambda)$. Thus, for non-approximated variational TBR, bounds can be obtained on the expected error $$E\{\|\hat{x}_0 - x_0\|_2^2\} \le \sum_{k=Q+1}^{N} \sigma_k^2 \tag{32}$$

where in this case the $\sigma$'s are the eigenvalues of the variational Grammian XI. This follows from the standard Karhunen-Loeve analysis.

In the approximate PMTBR context, in principle, we can control error by monitoring convergence of the integral defining $X_\lambda$ and then using the above error bounds. However, due to the projection process, very good reduced models are usually obtained before the integrals defining $X_\lambda$ converge to tight tolerances. Knowledge of approximate singular values allows control over errors in a statistical sense by monitoring convergence of the singular values/vectors, and ensuring that modes corresponding to small singular values of X are truncated. Error control can be implemented for Monte-Carlo type rules, since sample points may be deleted, added, or intermixed in an arbitrary way without effecting the properties of the underlying quadrature. The convergence of the singular values/vectors can be monitored on a term-by-term basis, using leave-one-out estimates, or use k-fold cross-validation. For more structured rules, such as the quasi-Monte-Carlo rules, either extensible lattices can be used, or a new set of sampling points.

In a numerical implementation, it is undesirable to re-compute multiple SVD decompositions of the matrix Z. Thus, embodiments use a rank-revealing factorization that can be easily updated once a column is added to Z.

Although references have been made in the foregoing description to various embodiments, persons of ordinary skill in the art will recognize that insubstantial modifications, alterations, and substitutions can be made to the described embodiments without departing from the accompanying claims. For example, although specific examples of rank revealing factorizations have been identified, other suitable methodologies can also be used if they provide some indication that can be used to asses how valuable certain information may be. Further, the methods described herein have broad applications—to modeling various circuit components, modeling interconnections between or among circuit components, or Further, the same technique can be used to form different sizes of reduced models if different degrees of accuracy are required. Thus, embodiments are flexible and can be used to form various sizes of reduced models with varying degrees of accuracy since different applications and systems may require varying degrees of accuracy.

What is claimed:

1. A method for implementing a circuit design of a circuit using a reduced model of the circuit, comprising:
    selecting a parameter of the circuit;
    selecting a plurality of values for the selected parameter without reference to a nominal value of the selected parameter to model variation of a characteristic of a circuit feature in the circuit;
    solving an equation for the circuit with each of the selected plurality of values, thereby generating a corresponding result, in which the each of the selected plurality of values is used in forming a coefficient of the equation for the circuit;
    repeating the action of selecting and the action of solving for remainder of the selected plurality of values and, for each iteration of the action of selecting and the action of solving, determining whether a sufficient number of the corresponding result has been generated to form the reduced model;
    generating the reduced model from the corresponding result by using a processor and displaying the reduced model or storing the reduced model in a computer storage device, wherein the reduced model provides an accurately sized model which accounts for the variation of the characteristic of the circuit feature, and the variation comprises electrical or geometrical deviation of the characteristic from a target electrical or geometrical value due to fabrication or processing; and
    implementing the circuit design which is used for the fabrication or processing of the characteristic of the circuit feature by running a simulation on the reduced model.

2. The method of claim 1, the act of selecting the parameter comprising selecting a parameter associated with a process for manufacturing the circuit.

3. The method of claim 2, the act of selecting the parameter associated with a process comprising selecting a thickness or a width of a circuit component, an inter-line spacing of a circuit component, a conductivity or a dielectric constant of a circuit component, a metal density of a circuit component, or an inter-layer dielectric thickness of a circuit component.

4. The method of claim 1, the act of selecting the parameter comprising selecting the parameter of a circuit component of the circuit.

5. The method of claim 4, the act of selecting the parameter of the electrical component comprising selecting a current, a voltage, a resistance, a capacitance, an inductance, or a frequency of the circuit component.

6. The method of claim 1, in which the act of selecting The plurality of values comprises selecting the plurality of values using a Gaussian rule.

7. The method of claim 1, in which the act of selecting the plurality of values comprises selecting the plurality of values using a Monte Carlo rule.

8. The method of claim 1, in which the act of selecting the plurality of values comprises selecting the plurality of values using a quasi-Monte Carlo rule.

9. The method of claim 1, in which the act of selecting the plurality of values comprises selecting the plurality of values using a hyperbolic crosspoint construction, a tensor product rule, or a Latin Hypercube sampling.

10. The method of claim 1, further comprising adjusting a manner in which the act of selecting the plurality of values is performed.

11. The method of claim 10, in which the act of adjusting further comprises performing a truncated balance realization.

12. The method of claim 1, the act of determining whether a sufficient number of results being performed using a collection of results that were generated by iterations of the act of solving the equation.

13. The method of claim 1, further comprising performing a rank revealing factorization.

14. The method of claim 13, wherein the rank revealing factorization is first performed on a matrix having first number of vectors and then performed on a matrix having a second number of vectors, the second number of vectors being greater than the first number of vectors.

15. The method of claim 14, wherein the second number of vectors is one more than the first number of vectors.

16. The method of claim 13, the act of performing the rank revealing factorization comprising performing a singular value decomposition.

17. The method of claim 16, the act of performing the singular value decomposition comprising performing a rank revealing factorization of ZW, wherein Z is a matrix, W is a diagonal matrix, and a singular value decomposition of ZW is $ZW = V_z S_z U_z$.

18. The method of claim 17, the matrix $S_z$ comprising singular values.

19. The method of claim 18, the singular values indicating importance or significance of each result and how much information the each result adds to a matrix that is used to generate the reduced model.

20. The method of claim 19, wherein each iteration of executing the equation generates a result that is of less relative significance than a result generated by a previous iteration of the equation.

21. The method of claim 13, the act of performing the rank revealing factorization comprising performing a ULV/URV decomposition.

22. The method of claim 13, the act of performing the rank revealing factorization comprising performing a UTV decomposition.

23. The method of claim 13, the act of performing the rank revealing factorization comprising performing a RRQR factorization.

24. The method of claim 1, the act of determining comprising controlling a size of a matrix or a vector that is used to form the reduced model.

25. The method of claim 1, the act of determining whether the sufficient number of the corresponding results has been generated comprising monitoring convergence of an integral defining a variational Grammian.

26. The method of claim 1, the act of generating the reduced model comprising generating a reduced model of an analog circuit.

27. The method of claim 1, the act of generating the reduced model comprising generating a reduced model of a radio frequency circuit.

28. The method of claim 1, the act of generating the reduced model comprising performing a projection-based reduction using results of a rank revealing factorization.

29. The method of claim 13, in which the rank revealing factorization-is performed on a collection of the result.

30. The method of claim 13, in which the act of performing a rank revealing factorization comprises comparing coefficients of principal vectors.

31. The method of claim 1, in which the act of repeating the selecting a plurality of values and solving the circuit further comprises:

for each iteration, performing a singular value decomposition on a collection of results, whereby values generated by the singular value decomposition indicate a quantity of information embodied in the collection of results for use in the act of determining whether the sufficient number of results have been generated to form the reduced model.

32. The method of claim 31, in which the act of performing the singular value decomposition comprises performing the singular value decomposition using a projection-based factorization.

33. The method of claim 10, in which the act of adjusting further comprises performing a poor-man truncated balance realization.

34. The method of claim 10, in which the act of adjusting further comprises performing a poor-man variational truncated balance realization.

35. The method of claim 13, the act of performing the rank revealing factorization comprising performing a QR factorization.

36. The method of claim 1, in which two of the plurality of values for the selected parameter are characterized by being capable of deviating substantially from each other and need not be based upon a nominal value.

* * * * *

UNITED STATES PATENT AND TRADEMARK OFFICE
CERTIFICATE OF CORRECTION

| | |
|---|---|
| PATENT NO. | : 7,590,518 B2 |
| APPLICATION NO. | : 10/932406 |
| DATED | : September 15, 2009 |
| INVENTOR(S) | : Joel R. Phillips |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 281 days.

Signed and Sealed this

Twenty-first Day of September, 2010

David J. Kappos
*Director of the United States Patent and Trademark Office*